United States Patent [19]

Hwang

[11] Patent Number: 5,337,325

[45] Date of Patent: Aug. 9, 1994

[54] SEMICONDUCTOR, LIGHT-EMITTING DEVICES

[75] Inventor: Cherng-Jia Hwang, Watchung, N.J.

[73] Assignee: Photon Imaging Corp, S. Plainfield, N.J.

[21] Appl. No.: 878,198

[22] Filed: May 4, 1992

[51] Int. Cl.⁵ ............................................. H01S 3/04
[52] U.S. Cl. ...................................... 372/36; 372/75; 385/115; 385/121
[58] Field of Search ............... 385/115, 121; 372/75, 372/36

[56] References Cited

U.S. PATENT DOCUMENTS

| | | | |
|---|---|---|---|
| 4,770,482 | 9/1988 | Sweeny et al. | 385/115 |
| 4,890,289 | 12/1989 | Basu et al. | 372/33 |
| 5,015,066 | 5/1991 | Cressman | 385/115 |
| 5,061,035 | 10/1991 | Roger, Jr. | 385/115 |
| 5,202,893 | 4/1993 | Kubota et al. | 372/75 |

Primary Examiner—James W. Davie
Attorney, Agent, or Firm—Herbert M. Shapiro

[57] ABSTRACT

A plurality of linear arrays of lasers are configured into an area array by optical coupling to a linear-to-area array by optical coupling to a linear-to-area fiber optic bundle. The linear face of the bundle is coupled to the linear array of lasers. By activating all the lasers simultaneously or selectively, a single high power output or high intensity signals at discrete addresses in the area face of the bundle are achieved respectively. Applications for high power, two dimensional laser devices, high definition display, solid state laser pumping and others are achieved.

8 Claims, 2 Drawing Sheets

SEMICONDUCTOR, LIGHT-EMITTING DEVICES

FIELD OF THE INVENTION

This invention relates to semiconductor, light-emitting devices such as lasers, and, more particularly, to a plurality of such devices constructed in a single semiconductor chip.

BACKGROUND OF THE INVENTION

Semiconductor lasers are well understood in the art and are available commercially. Some such devices are characterized by high power outputs particularly when a plurality of the devices are produced in a linear array.

Even higher power outputs are achieved when linear arrays of lasers are stacked, one on top of another, to form an area (or two-dimensional) array. But because of the difficulty in extracting the heat generated by each individual linear array, there is a limit to the output power realized from a given linear array stack. Specifically, the maximum power that can be realized from a linear array stack is well below the sum of the outputs from the individual linear arrays. Furthermore, the yield of two-dimensional arrays is very low because of delicate and cumbersome assembly procedures.

Yet a two-dimensional array of high power lasers clearly would find enthusiastic commercial use in solid state, laser pumping, medical application and in industrial welding and cutting applications as well as many others. But such a prise has eluded optoelectronic manufacturers although hundreds of millions of dollars have been spent in attempts to produce such high power, two-dimensional, laser arrays.

U.S. Pat. No. 4,674,834 issued Jun. 23, 1987 discloses electronic scanners and printers employing a bundle of optical fibers in which the fiber ends at one face of the bundle are arranged in a linear array and the ends at the opposite face of the bundle are arranged in a two-dimensional (area) array. For scanner applications, an area array of light sensors is affixed (optically) to the area face, and the consecutive positions of a beam of light moved incrementally along the linear face of the bundle are associated with consecutive addresses of the sensors illuminated for each such position. In this manner, the exit positions in the area face are organized to correspond to the consecutive positions in the linear face and even a noncoherent fiber optic bundle can be made "coherent" electronically.

For printer applications, an array of light sources is juxtaposed with the area face of the fiber optic bundle and the relationships between the pixels at the linear face and the light sources at the area face of the bundle is similarly determined.

Further, multicore, optical fibers included within each fiber array of optical fibers, are also well known in the art and available commercially.

BRIEF DESCRIPTION OF ILLUSTRATIVE EMBODIMENTS OF THIS INVENTION

In accordance with the principles of this invention, a fiber optic bundle, linear at a first face and having its linear first face optically coupled to the lasers of a linear array of lasers. The power of all the light outputs from the individual lasers of the linear array transmit through the associated fibers and appear at the area face of the bundle. In this manner, the elusive, high power, area laser array is achieved.

The use of multicore fibers ensures that the light outputs from individual lasers do not couple together optically for embodiments where such decouping is desirable. Thus, the light from each individual laser emerges from the area face of the fiber optic bundle independently without mixing with the light output from other lasers. Furthermore, the packing density of the fibers at the area face of the bundle can be very high, resulting in a high power, two-dimensional laser with a very small emitting area.

Also, the emission angle of each laser in the array could be preserved by using a fiber, the numerical aperture (NA) of which is such that the accepting angle of the fiber is greater than the emission angle of the associated laser. Alternatively, a smaller NA could be used so that the emission angle of the area laser, which is defined by the sum of all the individual lasers, is determined by the NA of the fibers used.

Further, by activating selected lasers in the linear array of lasers (or light-emitting diodes), light signals can be made to emanate from selected addresses in the area face of a linear-to-area fiber optic bundle which has it's linear face coupled to the linear array of lasers. In this manner, a high definition display application can be implemented in a manner analogous to that disclosed in Copending application Ser. No. 07/467,863 now U.S. Pat. No. 5,117,245 issued May 26, 1993 filed Jan. 22, 1990 and assigned to the assignee of the present application.

In each instance, a linear array of light sources is coupled to the linear face of a linear-to-area fiber optic bundle on a one-to-one basis, where a light source is positioned to correspond to the end of an associated fiber in the linear face of the bundle. In the first instance, all the light sources are activated at once to produce a high power, light output over an area defined by the area face of the bundle. In the second instance, selective activation of the light sources in the linear array of light sources permits a bright display useful for a two-dimensional display of any resolution as in high definition television. For embodiments where selective activation of lasers is employed, it is necessary to initialize the system to obtain the relationships between the various fiber entrance and exit positions in a manner analogous to that described above. The initialization procedure is minimal particularly with fiber optic bundles composed of ribbons of fibers arranged side-by-side at a linear face and stacked one on top of another in the area face as disclosed in Copending application Ser. No. 07/532,932 filed Jun. 4, 1990, now U.S. Pat. No. 5,155,790 issued Oct. 13, 1992 and also assigned to the assignee of the present application.

DETAILED DESCRIPTION OF ILLUSTRATIVE EMBODIMENT OF THIS INVENTION

Figure 1:
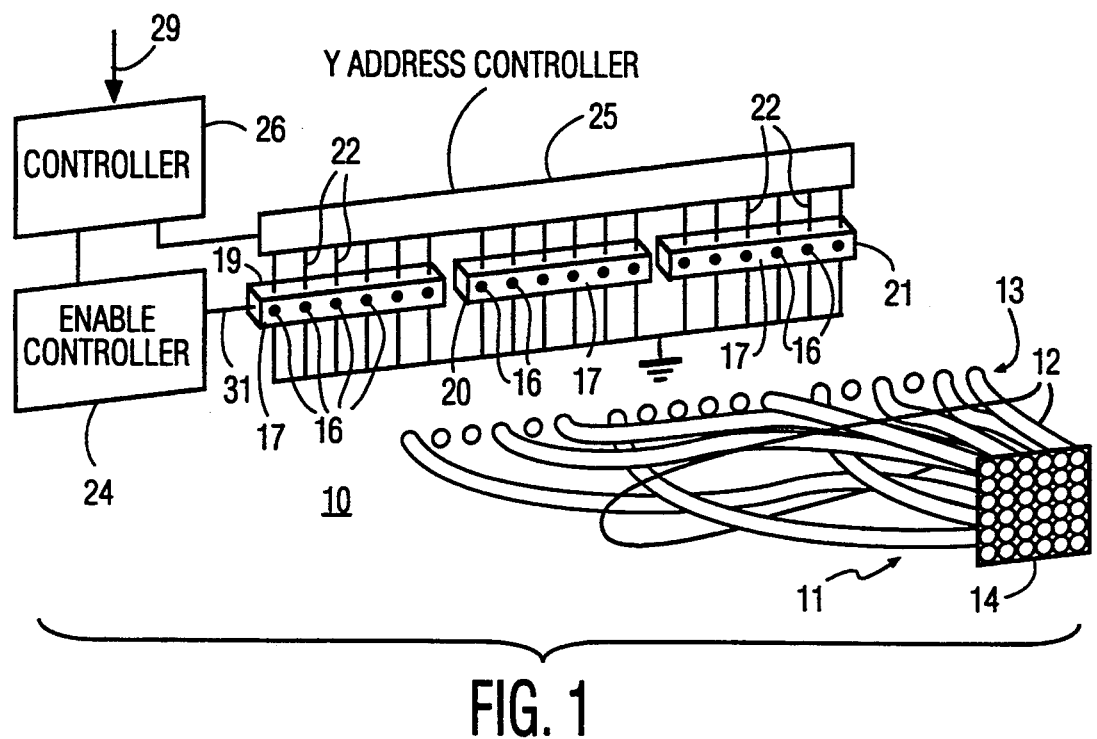
FIG. 1 is a schematic representation of area laser light source apparatus in accordance with the principles of this invention.
Figure 2:
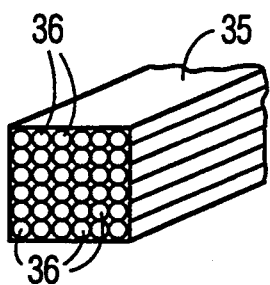
FIG. 2 is a schematic end view of a compound optical fiber useful in the apparatus of FIG. 1.

FIG. 1 shows, schematically, laser light generating apparatus 10 in accordance with the principles of this invention. The apparatus comprises a fiber optic bundle 11 shown encompassed by imaginary tie 12.

The fiber optic bundle has its fibers arranged in a linear array at a first face 13. The opposite ends of the fibers are arranged in a two-dimensional (area) array in a second face 14. The apparatus also includes a plurality of linear arrays of laser diodes 16 defined by well known photolithographic techniques, in semiconductor chips 17. Diodes 16 of commercially available laser diode arrays are spaced apart precise distances which correspond to the center-to-center spacings of the fiber ends in face 13 of the fiber optic bundle.

The arrays of linear diodes are designated 19, 20 and 21 from left to right as viewed in FIG. 1. The arrays re controlled (activated) by conductor leads already present in commercially available arrays and shown here as (x) line 27 and (y) lines 23 to ground. The x lead is connected to enable controller 24 and the y leads are connected to a y address controller 25. Controller 24 and 25 are connected to controller 26 for synchronization.

The fiber optic bundle in one embodiment is operative to direct the power output from the several linear arrays into a single high energy spot which corresponds in size to the area face 14 of the fiber optic bundle. Heat dissipation problems as well as the delicate and cumberance assembly problems attending the manufacturing of stacks of linear diodes, are eliminated by stacking the several linear arrays of lasers side-by-side as shown In the figure. Still all the power output of the several linear arrays in concentrated, by the fiber optic bundle, into the area of face 14 when all the diodes are activated simultaneously. Activation occurs in response to a signal by a user on input line 29 to controller 26.

Linear laser arrays are made up to one centimeter long having as many as 50 lasers in a row. The lasers have a diameter of 200 $\mu$m and are spaced apart 200 $\mu$m. Each laser is capable of a power output of 500 mw. The linear face 13 of the fiber optic bundle has the fiber ends with a diameter of 80 $\mu$m spaced apart 80 $\mu$m to match the linear arrays on a one-to-one basis. Thus, the fibers are capable of transmitting the output power of the lasers, vertically undiminished, to the area face 14 of the bundle.

Area face 14 of a bundle of such fibers, with diameters of 80 $\mu$m as noted, can be formed with an area of any size. Thus, the full power of a "stack" of linear arrays of laser dimes can be delivered to an output (viz: the area face) without actually making a stack. The full power of a plurality of linear arrays of lasers can be delivered, similarly, to an area face of a fiber optic bundle. Even the power of several stacks of linear arrays of laser, spaced to permit heat dissipation, can be delivered in this manner. Thus, a fiber optic array, linear at one face and having an area second face is operative to deliver power from a plurality of linear laser arrays to a spot defined by the area face of the bundle. A plurality of such arrangements also can be stacked and the area faces combined by well known techniques, to define the area of power output.

Figure 3:
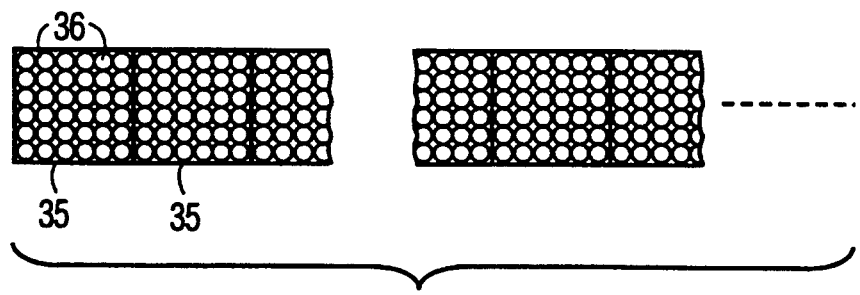
FIG. 3 is a schematic end view of a plurality of compound optical fibers of FIG. 2 arranged in a linear array.
Figure 4:
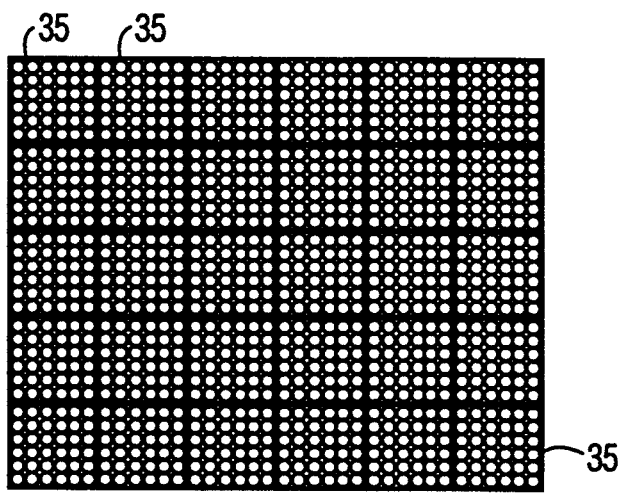
FIG. 4 is a schematic end view of the area face of a fiber optic bundle comprising a plurality of linear arrays of FIG. 3.

Figure two shows an end view of an optical fiber 35 which includes within it a plurality of optical fibers 36. Fibers of this kind are called "compound" fibers and are available commercially from a number of suppliers. FIG. 3 shows a plurality of such compound fibers arranged in a linear array. Each fiber within the multicore fiber has a diameter which is small compared to the diameter of a laser 16. Optical fibers 35 are shown as rectangular, in end view, but are available in many other geometries. Fibers 35 maybe of a dimension such that the center-to-center distances between fibers correspond to the distances between adjacent lasers 16. Such multicore fibers are available in ribbon form as indicated in FIG. 3. The ends of the ribbons are arranged in a linear array at one face of a fiber optic bundle made from such ribbons. The opposite face of the bundle is made by stacking the ribbons into an arrangement as shown in FIG. 4. The use of muticore fibers relaxes the constraints on matching fiber spacings with laser spacings because the feature sizes of the multicore structure of the compound fibers is so small compared to the laser size, that the image of the laser can be off center and still all the energy output from the laser will be delivered to the area face of the bundle.

FIG. 1 has been described in terms of turning on all lasers simultaneously to deliver a power output useful, for example, for welding. But selective activation of the lasers permits a solid state cathode ray tube operation to be achieved or a display where any number of light sources can be turned on simultaneously. In such embodiments, controller 26 is responsive to activate lines 23 via the y address controller 25 to activate laser 16 in accordance with, say, video signals input via (representative) line 29.

What is claimed is:

1. Apparatus comprising a plurality of linear semiconductor laser arrays and a fiber optic bundle having a linear first face and an area second face, said linear first face being divided into a plurality of sections each corresponding to a respective one of said linear laser arrays, said area face comprising a stack of said sections for forming a virtual stack of said laser arrays.

2. Apparatus as set forth in claim 1 also including means for turning on and off all of said light sources simultaneously.

3. Apparatus as set forth in claim 1 also including means for turning said light sources on and off selectively.

4. Apparatus as set forth in claim 3 also including means for adjusting the input electrical currents to said lasers selectively.

5. Apparatus as set forth in claim 1 wherein said lasers have a characteristic emission angle and the numerical aperture of said fibers is greater than said emission angle.

6. Apparatus as set forth in claim 1 wherein said laser have a characteristic emission angle and the numerical aperture of said fibers is smaller than said emission angle.

7. Apparatus as set forth in claim 1 wherein each of said fibers is a multicore fiber.

8. Apparatus as set forth in claim 1 wherein each of said sections comprises a fiber ribbon.

* * * * *